(12) United States Patent
Liu et al.

(10) Patent No.: US 11,908,804 B2
(45) Date of Patent: Feb. 20, 2024

(54) ARRAY SUBSTRATE AND DISPLAY PANEL

(71) Applicant: Shenzhen China Star Optoelectronics Semiconductor Display Technology Co., Ltd., Guangdong (CN)

(72) Inventors: Linfeng Liu, Guangdong (CN); Aihua Tang, Guangdong (CN); Yanxi Ye, Guangdong (CN); Chihming Yang, Guangdong (CN); Yunglun Lin, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 186 days.

(21) Appl. No.: 16/759,343

(22) PCT Filed: Dec. 17, 2019

(86) PCT No.: PCT/CN2019/126103
§ 371 (c)(1),
(2) Date: Apr. 26, 2020

(87) PCT Pub. No.: WO2021/114326
PCT Pub. Date: Jun. 17, 2021

(65) Prior Publication Data
US 2021/0175179 A1 Jun. 10, 2021

(30) Foreign Application Priority Data
Dec. 10, 2019 (CN) .......................... 201911257740.2

(51) Int. Cl.
*H01L 23/544* (2006.01)
*H01L 27/12* (2006.01)

(52) U.S. Cl.
CPC .......... *H01L 23/544* (2013.01); *H01L 27/124* (2013.01); *H01L 2223/5442* (2013.01); *H01L 2223/54426* (2013.01)

(58) Field of Classification Search
CPC ................ H01L 23/544; H01L 27/124; H01L 2223/5442; H01L 2223/54426
(Continued)

(56) References Cited

U.S. PATENT DOCUMENTS 10,020,254 B1 * 7/2018 Bao .................. H01L 23/53228
2001/0006409 A1 * 7/2001 Lee ................... G02F 1/134363
349/110
(Continued)

FOREIGN PATENT DOCUMENTS

CN 100443978 C 12/2008
CN 107505754 A 12/2017
(Continued)

*Primary Examiner* — Ori Nadav
(74) *Attorney, Agent, or Firm* — Rivka Friedman

(57) ABSTRACT

The present invention provides an array substrate and a display panel. The array substrate includes a substrate, a first metal layer, a second metal layer, a pixel electrode layer, and an alignment identification terminal that are sequentially stacked. The alignment identification terminal is disposed in at least one of the first metal layer and the second metal layer, and is at least partially disposed in a sub-pixel electrode region. An arrangement of the alignment identification terminal is no longer limited by a narrow frame, and a size can be made larger to meet the needs of a CCD identification, ensuring an accuracy of identification and alignment.

6 Claims, 10 Drawing Sheets

(58) Field of Classification Search
USPC .......................................................... 257/72
See application file for complete search history.

(56) References Cited

U.S. PATENT DOCUMENTS

| | | | |
|---|---|---|---|
| 2015/0185569 A1* | 7/2015 | Liao | G02F 1/133345 |
| | | | 349/39 |
| 2016/0187746 A1* | 6/2016 | Yue | G02F 1/1337 |
| | | | 349/123 |
| 2016/0246108 A1* | 8/2016 | Hsu | G02F 1/133514 |
| 2019/0131359 A1 | 5/2019 | Kong et al. | |
| 2019/0229066 A1 | 7/2019 | Chang et al. | |
| 2019/0326336 A1* | 10/2019 | Xi | H01L 23/544 |
| 2020/0321321 A1* | 10/2020 | Takeya | H01L 25/0753 |
| 2021/0003454 A1* | 1/2021 | Ruther | G01J 5/07 |
| 2021/0013247 A1* | 1/2021 | Xi | H01L 27/1288 |

FOREIGN PATENT DOCUMENTS

| | | |
|---|---|---|
| CN | 109727955 A | 5/2019 |
| CN | 110071093 A | 7/2019 |
| CN | 110148606 A | 8/2019 |
| IN | 204242148 U | 4/2015 |
| KR | 20160057015 A | 5/2016 |

\* cited by examiner

ARRAY SUBSTRATE AND DISPLAY PANEL

FIELD OF INVENTION

The present invention relates to the field of displays, and in particular, to an array substrate and a display panel.

BACKGROUND OF INVENTION

In manufacturing processes of display panels, alignment identification terminals are mainly used for alignments of machines and substrates.

In conventional designs, the alignment identification terminals are disposed outside display regions of the display panels and within frame regions. However, for display panels with ultra-narrow frames (a width of the frame is less than 1 mm), there is insufficient space in the frame regions, and arrangements of the alignment identification terminals are limited, which will cause risks that charge-coupled device (CCD) camera will not identify them.

Therefore, current display panels have problems that alignment identification terminals cannot be identified, and thus needs to be solved.

Technical Problem

The present invention provides an array substrate and a display panel to alleviate a problem that current display panel cannot identify alignment identification terminals.

Technical Solution

In order to solve the above problems, the technical solution provided by present invention is as follows:

The present invention provides an array substrate comprising:
  a base;
  a first metal layer formed on the base;
  a second metal layer formed on the first metal layer;
  a pixel electrode layer formed on the second metal layer, wherein the pixel electrode layer is patterned to form a pixel electrode, and the pixel electrode comprises at least two sub-pixel electrodes; and
  an alignment identification terminal disposed in at least one of the first metal layer and the second metal layer, wherein the alignment identification terminal is at least partially disposed in a sub-pixel electrode region.

In the array substrate provided in the present invention, the alignment identification terminal is disposed in the first metal layer.

In the array substrate provided in the present invention, the alignment identification terminal is disposed in the second metal layer.

In the array substrate provided in the present invention, the alignment identification terminal comprises a first alignment identification terminal and a second alignment identification terminal, the first alignment identification terminal is disposed in the first metal layer, and the second alignment identification terminal is disposed in the second metal layer.

In the array substrate provided in the present invention, the first metal layer is a gate metal layer, and the second metal layer is a source-drain metal layer.

In the array substrate provided in the present invention, the alignment identification terminals are all disposed in the sub-pixel electrode region.

In the array substrate provided in the present invention, the alignment identification terminal is disposed at a middle position of the sub-pixel electrode region.

In the array substrate provided in the present invention, a portion of the alignment identification terminal is disposed in the sub-pixel electrode region.

In the array substrate provided in the present invention, a first portion of the alignment identification terminal is disposed in a first sub-pixel electrode region, a second portion of the alignment identification terminal is disposed in a second sub-pixel electrode region adjacent to the first sub-pixel electrode region, and a third portion of the alignment identification terminal connects to the first portion and the second portion is disposed in a non-pixel electrode region disposed between the first sub-pixel electrode region and the second sub-pixel electrode region.

In the array substrate provided in the present invention, a shape of the alignment identification terminal is a cross shape.

Simultaneously, the present invention further provides a display panel comprising an array substrate. The array substrate comprises:
  a base;
  a first metal layer formed on the base;
  a second metal layer formed on the first metal layer;
  a pixel electrode layer formed on the second metal layer, wherein the pixel electrode layer is patterned to form a pixel electrode, and the pixel electrode comprises at least two sub-pixel electrodes; and
  an alignment identification terminal disposed in at least one of the first metal layer and the second metal layer, wherein the alignment identification terminal is at least partially disposed in a sub-pixel electrode region.

In the array substrate provided in the present invention, the alignment identification terminal is disposed in the first metal layer.

In the array substrate provided in the present invention, the alignment identification terminal is disposed in the second metal layer.

In the array substrate provided in the present invention, the alignment identification terminal comprises a first alignment identification terminal and a second alignment identification terminal, the first alignment identification terminal is disposed in the first metal layer, and the second alignment identification terminal is disposed in the second metal layer.

In the array substrate provided in the present invention, the first metal layer is a gate metal layer, and the second metal layer is a source-drain metal layer.

In the array substrate provided in the present invention, the alignment identification terminals are all disposed in the sub-pixel electrode region.

In the array substrate provided in the present invention, the alignment identification terminal is disposed at a middle position of the sub-pixel electrode region.

In the array substrate provided in the present invention, a portion of the alignment identification terminal is disposed in the sub-pixel electrode region.

In the array substrate provided in the present invention, a first portion of the alignment identification terminal is disposed in a first sub-pixel electrode region, a second portion of the alignment identification terminal is disposed in a second sub-pixel electrode region adjacent to the first sub-pixel electrode region, and a third portion of the alignment identification terminal connects to the first portion and the second portion is disposed in a non-pixel electrode region disposed between the first sub-pixel electrode region and the second sub-pixel electrode region.

In the array substrate provided in the present invention, a shape of the alignment identification terminal is a cross shape.

Beneficial Effect

The present invention provides an array substrate and a display panel. The array substrate comprises a base, a first metal layer formed on the base, a second metal layer formed on the first metal layer, a pixel electrode layer formed on the second metal layer, wherein the pixel electrode layer is patterned to form a pixel electrode, and the pixel electrode comprises at least two sub-pixel electrodes, and an alignment identification terminal disposed in at least one of the first metal layer and the second metal layer, wherein the alignment identification terminal is at least partially disposed in a sub-pixel electrode region. By disposing the alignment identification terminal in a display region of the substrate and at least partially within the sub-pixel electrode region, an arrangement of the alignment identification terminal is no longer limited by a narrow frame, and a size can be made larger to meet needs of a CCD identification, ensuring an accuracy of identification and alignment of the alignment identification terminal in a panel manufacturing process.

DESCRIPTION OF DRAWINGS

FIG. 1 (b) is a schematic plan view of a second metal layer of the first structure of the array substrate provided in the embodiment of the present invention.

FIG. 1 (c) is a schematic plan view of a pixel electrode layer of the first structure of the array substrate provided in the embodiment of the present invention.

FIG. 3 (b) is a schematic plan view of a second metal layer of the second structure of the array substrate provided in the embodiment of the present invention.

FIG. 3 (c) is a schematic plan view of a pixel electrode layer of the second structure of the array substrate provided in the embodiment of the present invention.

FIG. 5 (b) is a schematic plan view of a second metal layer of the third structure of the array substrate provided in the embodiment of the present invention.

FIG. 5 (c) is a schematic plan view of a pixel electrode layer of the third structure of the array substrate provided in the embodiment of the present invention.

FIG. 7 (b) is a schematic plan view of a second metal layer of the fourth structure of the array substrate provided in the embodiment of the present invention.

FIG. 7 (c) is a schematic plan view of a pixel electrode layer of the fourth structure of the array substrate provided in the embodiment of the present invention.

FIG. 9 (b) is a schematic plan view of a second metal layer of the fifth structure of the array substrate provided in the embodiment of the present invention.

FIG. 9 (c) is a schematic plan view of a pixel electrode layer of the fifth structure of the array substrate provided in the embodiment of the present invention.

DETAILED DESCRIPTION OF PREFERRED EMBODIMENTS

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

The present invention provides an array substrate to alleviate a problem that current display panels do not identify alignment identification terminals.

In an embodiment, the array substrate provided in the present invention comprises:
 a base;
 a first metal layer formed on the base;
 a second metal layer formed on the first metal layer;
 a pixel electrode layer formed on the second metal layer, wherein the pixel electrode layer is patterned to form a pixel electrode, and the pixel electrode comprises at least two sub-pixel electrodes; and
 an alignment identification terminal disposed in at least one of the first metal layer and the second metal layer, wherein the alignment identification terminal is at least partially disposed in a sub-pixel electrode region.

The embodiment of the present invention provides the array substrate. The array substrate is provided with the alignment identification terminal in a display region of the substrate, and is at least partially disposed in a sub-pixel electrode region. Because the pixel electrode is a transparent metal oxide film, it will not affect an identification of the alignment identification terminal, ensuring an accurate identification and alignment of the alignment identification terminal in a manufacturing process of a display panel.

The array substrate provided in the present invention may be an array substrate with a single-layer gate structure, an array substrate with a double-layer gate structure, or an array substrate with other structures. The pixel electrode in the array substrate can be a four-domain structure, an eight-domain structure, or any other structure. In the following, the single-layer gate structure and the four-domain structure array substrate will be used as an example for detailed explanation. In the following embodiments of the invention, the first metal layer is a gate metal layer, the second metal layer is a source-drain metal layer, and the pixel electrode is a four-domain structure.

Figure 1:
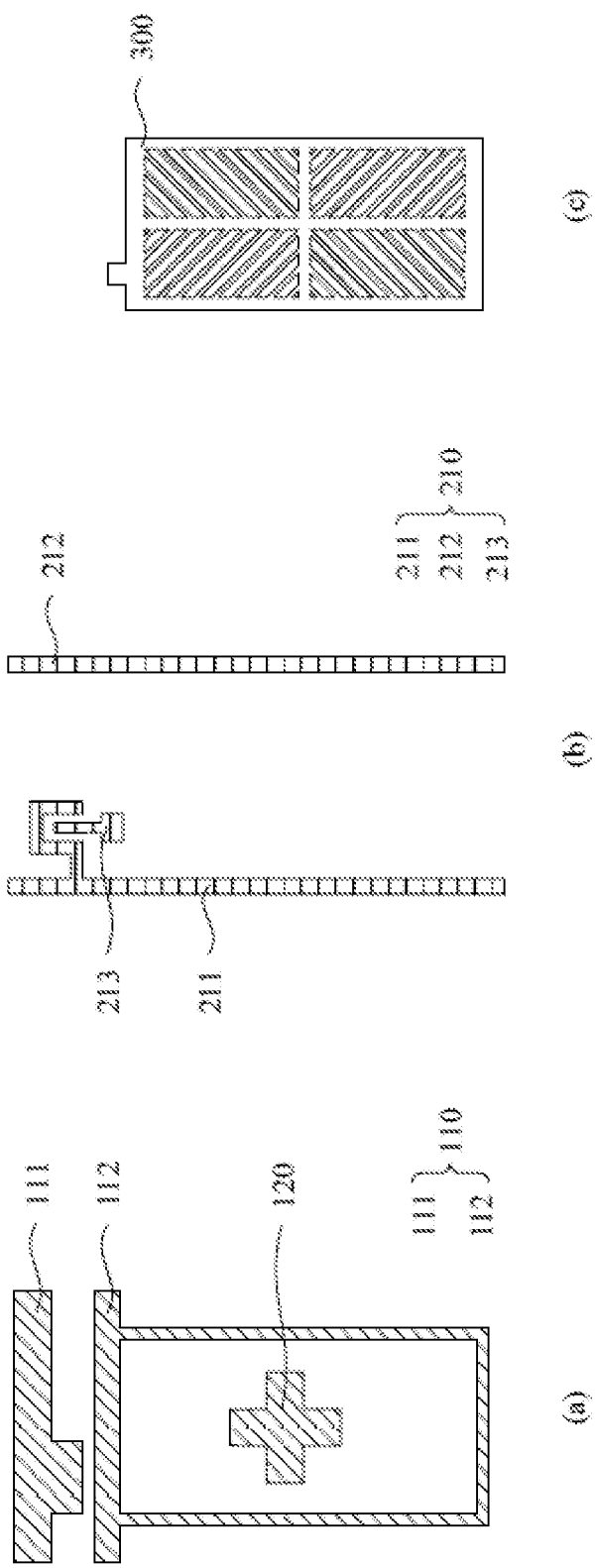
FIG. 1 (a) is a schematic plan view of a first metal layer of a first structure of an array substrate provided in an embodiment of the present invention.
Figure 2:
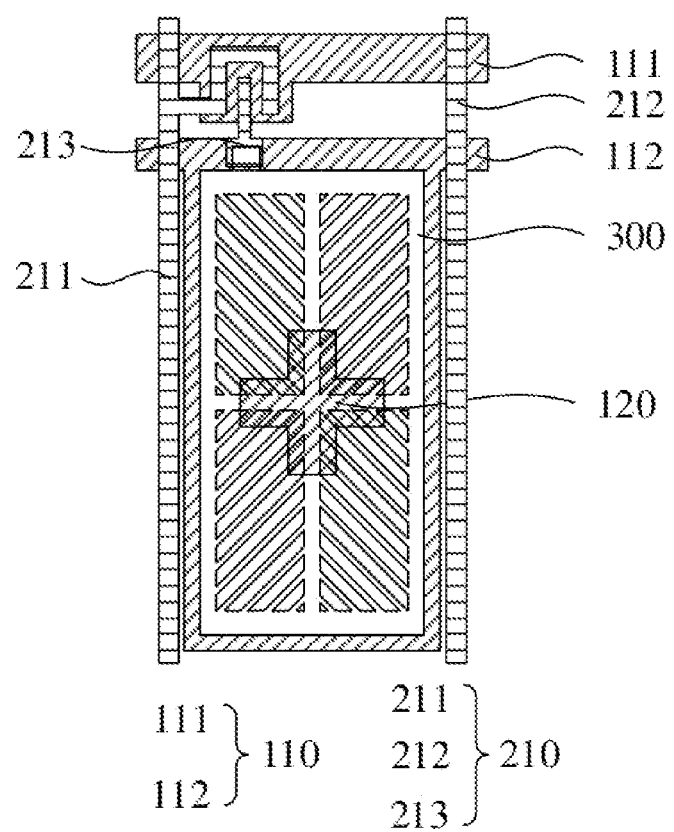
FIG. 2 is a schematic plan superposition view of the first metal layer, the second metal layer, and the pixel electrode layer of the first structure of the array substrate according to the embodiment of the present invention.

In an embodiment, as shown in FIG. 1 and FIG. 2, the alignment identification terminals are disposed in the first metal layer, and all of them are disposed in the pixel electrode region.

As shown in FIG. 1 (a), the first metal layer is patterned to form a first metal line 110 and an alignment identification terminal 120. The first metal line 110 comprises a first gate signal line 111 and a second gate signal line 112.

As shown in FIG. 1 (b), the second metal layer is patterned to form a second metal line 210. The second metal line 210 comprises a first data signal line 211, a second data signal line 212, and a signal connection line 213.

As shown in FIG. 1 (c), the pixel electrode layer is patterned to form a pixel electrode. The pixel electrode comprises a plurality of sub-pixel electrodes 300 arranged in an array.

In an embodiment, as shown in FIG. 2, the alignment identification terminal 120 is disposed at a position corresponding to centers of four domains of the sub-pixel electrode 300. A shape of the alignment identification terminal 120 is a cross shape. Since the sub-pixel electrode 300 has a four-domain structure, connection positions of the four domains of the sub-pixel electrode 300 constitute a "cross" disposed in a middle of the sub-pixel electrode 300. A pixel electrode material is disposed at the "cross" position. Disposing the alignment identification terminal 120 at a position corresponding to the "cross" pixel electrode and disposing the alignment identification terminal 120 in a cross shape can reduce effects on the sub-pixel aperture ratio due to the arrangement of the alignment identification terminal.

In other embodiments, the alignment identification terminal 120 may be disposed at another position within regions of the sub-pixel electrode 300. The shape of the alignment identification terminal 120 may also be set to a rectangle, a circle, or any other recognizable shape, which is not limited herein.

In the embodiment, the alignment identification terminal is disposed in the first metal layer and in the sub-pixel electrode region, so that the alignment identification terminal is no longer limited by a narrow frame, and an arrangement space is increased. The alignment identification terminal can be set to a recognizable size or shape as required, which ensures an accuracy of identification and alignment of the alignment identification terminal in a panel manufacturing process.

There is no second metal disposed in the sub-pixel electrode region. A material of the sub-pixel electrode is transparent metal oxide. There is no interference pattern around the alignment identification terminal, and a headroom is large, so it can be identified well. The alignment identification terminal can be identified from a side of the pixel electrode or from a side of the pixel electrode. The alignment identification terminal is suitable for both a transmissive light source and a reflective light source.

Figure 3:
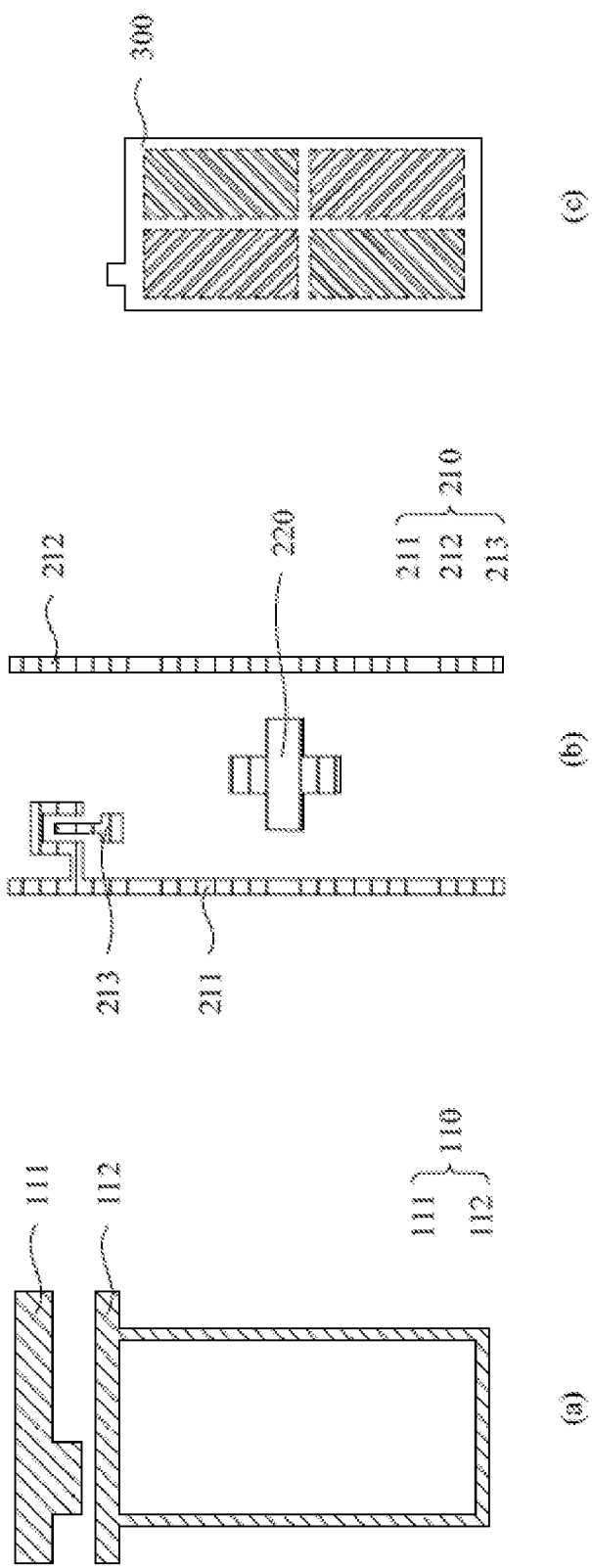
FIG. 3 (a) is a schematic plan view of a first metal layer of a second structure of an array substrate provided in an embodiment of the present invention.
Figure 4:
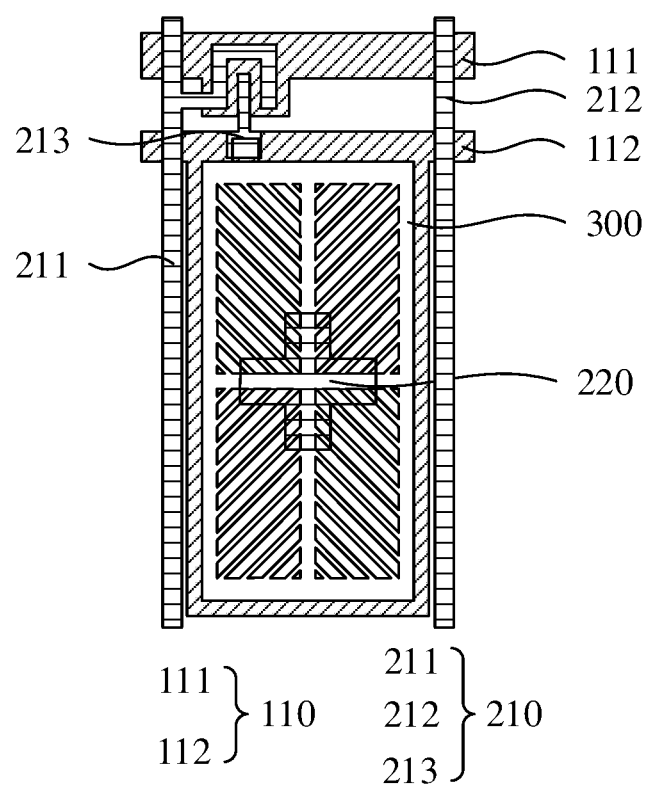
FIG. 4 is a schematic plan superposition view of the first metal layer, the second metal layer, and the pixel electrode layer of the second structure of the array substrate according to the embodiment of the present invention.

In another embodiment, as shown in FIG. 3 and FIG. 4, the alignment identification terminals are disposed in the second metal layer, and all of them are disposed in the pixel electrode region.

As shown in FIG. 3 (a), the first metal layer is patterned to form a first metal line 110. The first metal line 110 comprises a first gate signal line 111 and a second gate signal line 112.

As shown in FIG. 3 (b), the second metal layer is patterned to form a second metal line 210 and an alignment identification terminal 220. The second metal line 210 comprises a first data signal line 211, a second data signal line 212, and a signal connection line 213.

As shown in FIG. 3 (c), the pixel electrode layer is patterned to form a pixel electrode. The pixel electrode comprises a plurality of sub-pixel electrodes 300 arranged in an array.

In an embodiment, as shown in FIG. 4, the alignment identification terminal 220 is disposed at a position corresponding to centers of four domains of the sub-pixel electrode 300. A shape of the alignment identification terminal 220 is a cross shape, which can reduce effects on the sub-pixel aperture ratio due to the arrangement of the alignment identification terminal. In other embodiments, the alignment identification terminal 220 may be disposed at another position within regions of the sub-pixel electrode 300. The shape of the alignment identification terminal 220 may also be set to a rectangle, a circle, or any other recognizable shape, which is not limited herein.

In the embodiment, the alignment identification terminal is disposed in the second metal layer and in the sub-pixel electrode region, so that the alignment identification terminal is no longer limited by a narrow frame, and an arrangement space is increased. The alignment identification terminal can be set to a recognizable size or shape as required, which ensures the accuracy of identification and alignment of the alignment identification terminal in the panel manufacturing process.

There is no second metal disposed in the sub-pixel electrode region. A material of the sub-pixel electrode is transparent metal oxide. There is no interference pattern around the alignment identification terminal, and a headroom is large, so it can be identified well. The alignment identification terminal can be identified from a side of the pixel electrode or from a side of the pixel electrode. The alignment identification terminal is suitable for both a transmissive light source and a reflective light source.

Figure 5:
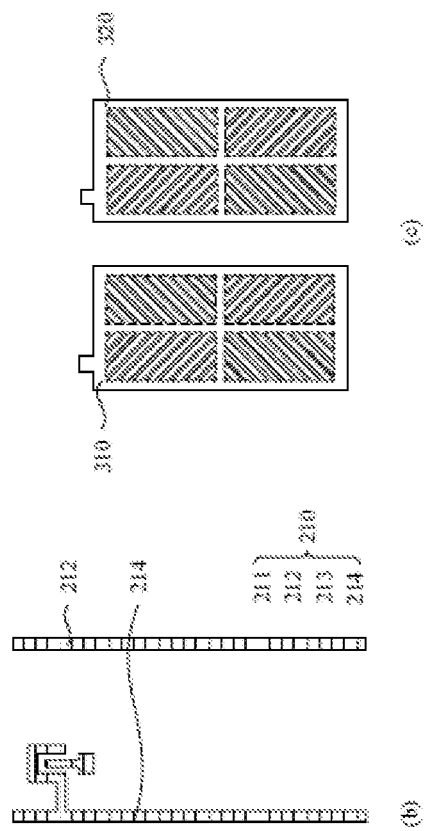
FIG. 5 (a) is a schematic plan view of a first metal layer of a third structure of an array substrate provided in an embodiment of the present invention.
Figure 5:
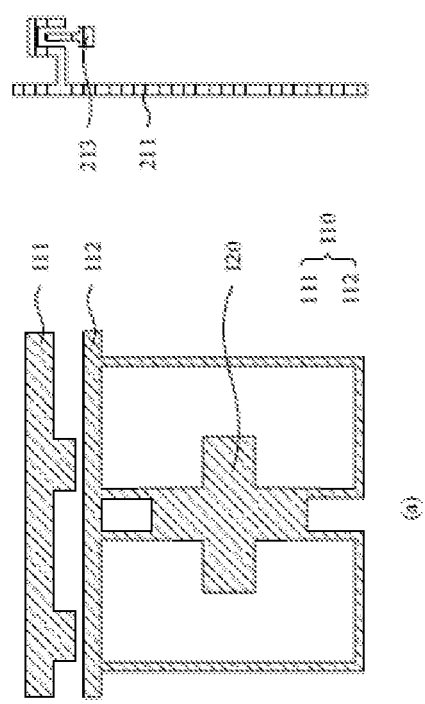
Figure 6:
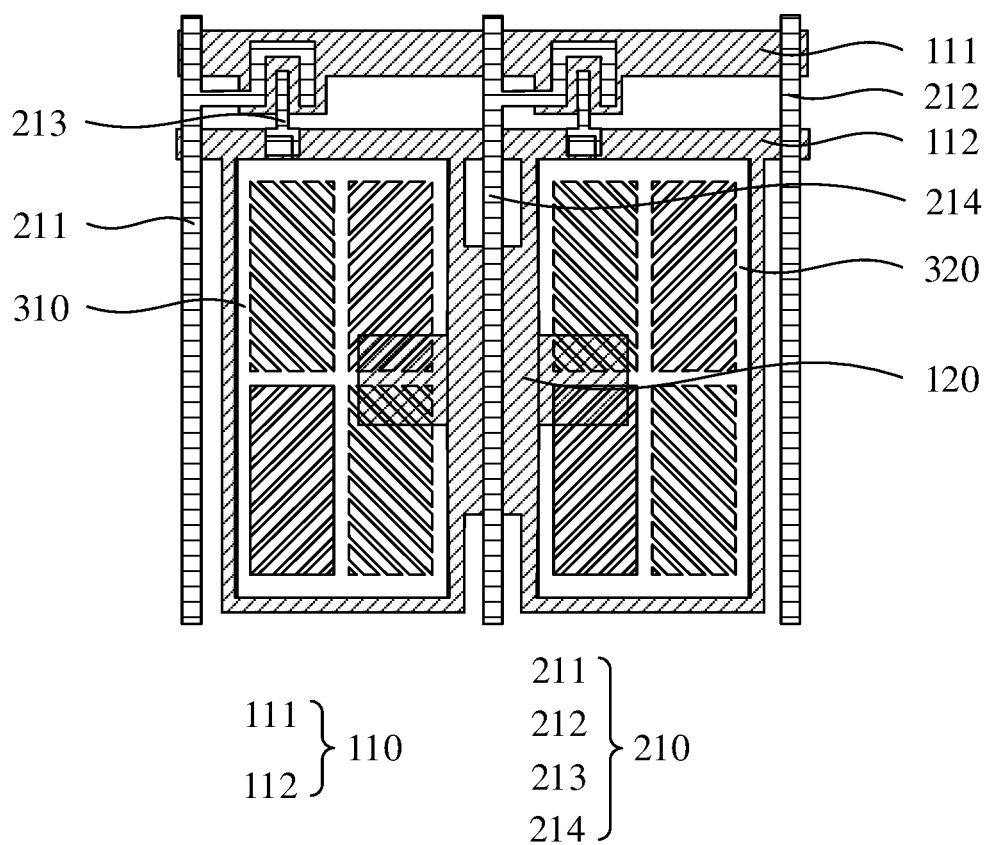
FIG. 6 is a schematic plan superposition view of the first metal layer, the second metal layer, and the pixel electrode layer of the third structure of the array substrate according to the embodiment of the present invention.

In an embodiment, as shown in FIG. 5 and FIG. 6, the alignment identification terminal is disposed in the first metal layer and partially disposed in the pixel electrode region.

As shown in FIG. 5 (a), the first metal layer is patterned to form a first metal line 110 and an alignment identification terminal 120. The first metal line 110 comprises a first gate signal line 111 and a second gate signal line 112, and the alignment identification terminal 120 and the second gate signal line 112 are integrally disposed. The alignment identification terminal 120 is used as a terminal for alignment identification in the array substrate, and at the same time, it is used to transfer the gate signal.

As shown in FIG. 5 (b), the second metal layer is patterned to form a second metal line 210. The second metal line 210 comprises a first data signal line 211, a second data signal line 212, a signal connection line 213, and a third data signal line 214.

As shown in FIG. 5 (c), the pixel electrode layer is patterned to form a pixel electrode. The pixel electrode comprises a plurality of first sub-pixel electrodes 310 and a second sub-pixel electrode 320 arranged in an array.

In an embodiment, as shown in FIG. 6, a first portion of the alignment identification terminal 120 is disposed in a first sub-pixel electrode region 310 and a second portion of the alignment identification terminal is disposed in a second sub-pixel electrode region 320, and a third portion of the alignment identification terminal connects to the first portion and the second portion is disposed in a non-pixel electrode region disposed between the first sub-pixel electrode region and the second sub-pixel electrode region. The alignment identification terminal 120 is disposed in a middle of the two adjacent sub-pixel regions.

A shape of the alignment identification terminal 120 is a cross shape. In other embodiments, the shape of the alignment identification terminal 120 may also be set to a rectangle, a circle, or any other recognizable shape, which is not limited herein.

In the embodiment, the alignment identification terminal 120 is arranged to across the pixels and is partially disposed in the two adjacent sub-pixel electrode regions. The two adjacent sub-pixel electrode regions average an effect of an arrangement of the alignment identification terminal on an aperture ratio of a single sub-pixel. The remaining part of the alignment identification terminal is disposed in a non-pixel electrode region between two adjacent sub-pixel electrode regions. The non-pixel electrode region is a non-pixel display region. The part of the alignment identification terminal in the non-pixel electrode region will not affect the aperture ratio of the pixel.

An arrangement of the alignment identification terminal is no longer limited by a narrow frame. An arrangement method of the cross-pixel makes a size of the alignment identification terminal larger. According to needs of a CCD identification, the alignment identification terminal can be set to identify any size or shape, which further ensures an accuracy of identification and alignment of the alignment identification terminal in a panel manufacturing process.

In the embodiment, since the second metal line 210 is disposed in the second metal layer within the non-pixel electrode region between the two adjacent sub-pixel electrode regions, the second metal line 210 will reflect the light transmitted from the pixel electrode side. Therefore, the alignment identification terminal provided in the embodiment can be identified only from a side facing away from the pixel electrode, and the alignment identification terminal is suitable for a reflective light source.

Figure 7:
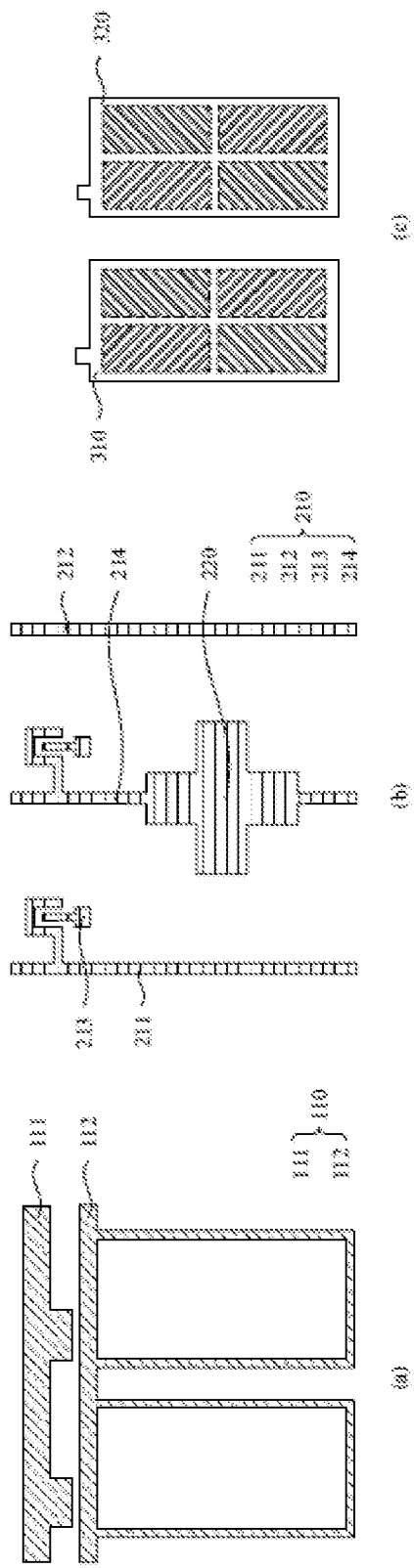
FIG. 7 (a) is a schematic plan view of a first metal layer of a fourth structure of an array substrate provided in an embodiment of the present invention.
Figure 8:
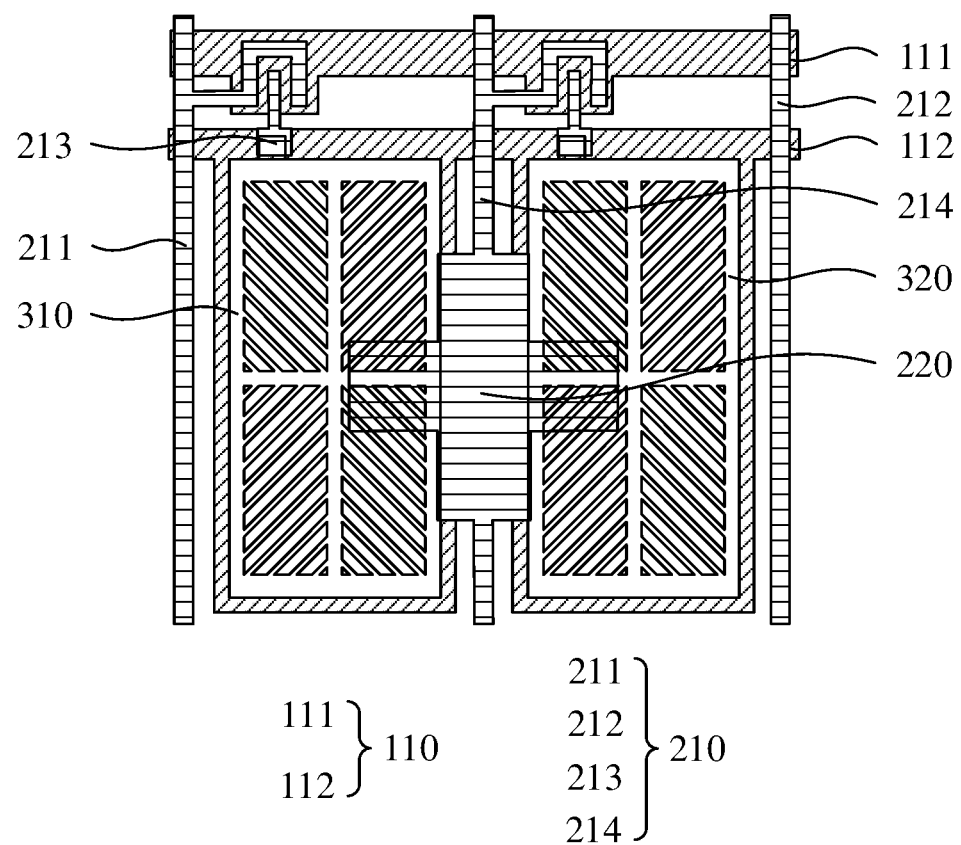
FIG. 8 is a schematic plan superposition view of the first metal layer, the second metal layer, and the pixel electrode layer of the fourth structure of the array substrate according to the embodiment of the present invention.

In another embodiment, as shown in FIG. 7 and FIG. 8, the alignment identification terminal is disposed in the second metal layer and is partially disposed in the pixel electrode region.

As shown in FIG. 7 (a), the first metal layer is patterned to form a first metal line 110. The first metal line 110 comprises a first gate signal line 111 and a second gate signal line 112.

As shown in FIG. 7 (b), the second metal layer is patterned to form a second metal line 210 and an alignment identification terminal 220. The second metal line 210 comprises a first data signal line 211, a second data signal line 212, a signal connection line 213, and the third data signal line 214. The alignment identification terminal 220 and the third data signal line 214 are integrally disposed. The alignment identification terminal 220 is used as a terminal for alignment identification in the array substrate, and at the same time, it is used to transfer data signals at its position.

As shown in FIG. 7 (c), the pixel electrode layer is patterned to form a pixel electrode. The pixel electrode comprises a plurality of first sub-pixel electrodes 310 and a plurality of second sub-pixel electrodes 320 arranged in an array.

In an embodiment, as shown in FIG. 8, a first portion of the alignment identification terminal 220 is disposed in a first sub-pixel electrode region 310 and a second portion of the alignment identification terminal is disposed in a second sub-pixel electrode region 320, and a third portion of the alignment identification terminal connects to the first portion and the second portion is disposed in a non-pixel electrode region disposed between the first sub-pixel electrode region 310 and the second sub-pixel electrode region 320. The alignment identification terminal 220 is disposed in a middle of two adjacent sub-pixel regions.

A shape of the alignment identification terminal 220 is a cross shape. In other embodiments, the shape of the alignment identification terminal 220 may also be set to a rectangle, a circle, or any other recognizable shape, which is not limited herein.

In the embodiment, the alignment identification terminal 220 is arranged to across the pixels and is partially disposed in the two adjacent sub-pixel electrode regions. An arrangement of the alignment identification terminal is no longer limited by a narrow frame. A size of the alignment identification terminal can be made larger. According to needs of a CCD identification, the alignment identification terminal can be set to any size or shape, which further ensures an accuracy of identification and alignment of the alignment identification terminal in a panel manufacturing process.

In the embodiment, since the first metal layer 110 is disposed within the first metal layer in the non-pixel electrode region between the two adjacent sub-pixel electrode regions, the first metal line 110 will be reflected will reflect the light transmitted from the pixel electrode side. Therefore, the alignment identification terminal provided in the embodiment can be identified only from the pixel electrode side, and the alignment identification terminal is suitable for a reflective light source.

Figure 9:
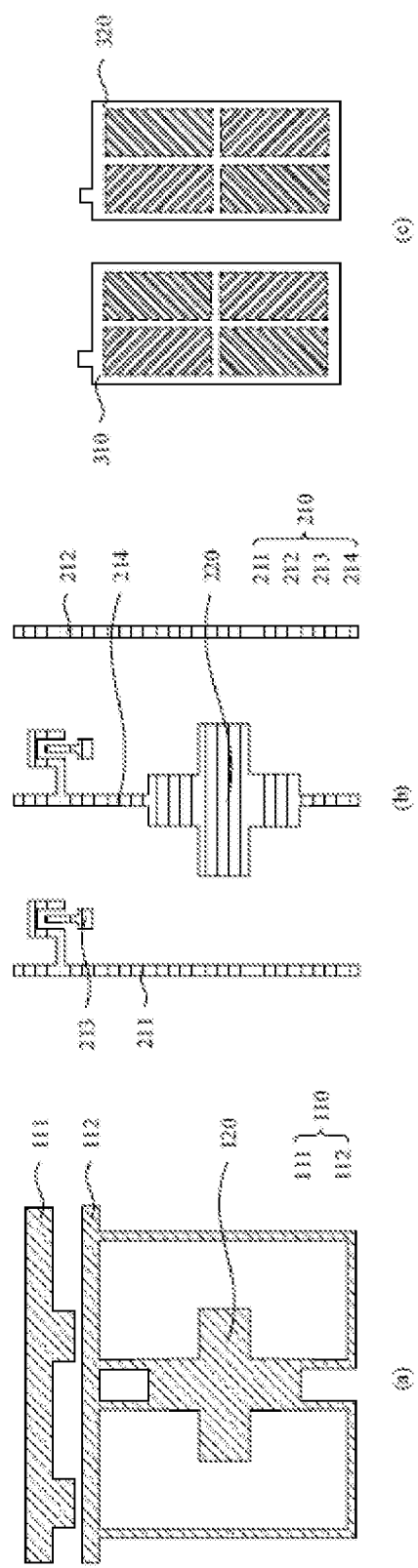
FIG. 9 (a) is a schematic plan view of a first metal layer of a fifth structure of an array substrate provided in an embodiment of the present invention.
Figure 10:
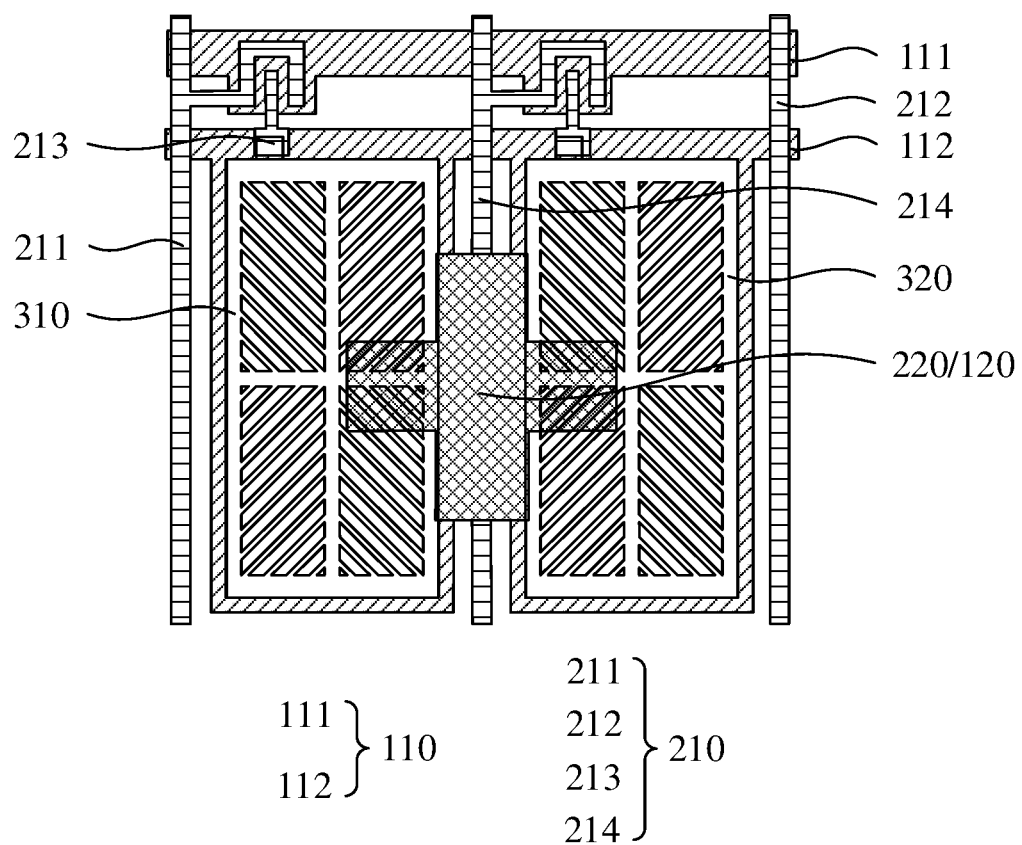
FIG. 10 is a schematic plan superposition view of the first metal layer, the second metal layer, and the pixel electrode layer of the fifth structure of the array substrate according to the embodiment of the present invention.

In yet another embodiment, as shown in FIG. 9 and FIG. 10, the alignment identification terminal comprises a first alignment terminal 120 and a second alignment terminal 220. The first alignment terminal 110 is disposed in the first metal layer, and the second alignment terminal 220 is disposed in the second metal layer.

As shown in FIG. 9 (a), the first metal layer is patterned to form a first metal line 110 and the first alignment terminal 120. The first metal line 110 comprises a first gate signal line 111 and a second gate signal line 112. The first alignment terminal 120 and the second gate signal line 112 are integrally formed. The first alignment terminal 120 is used as a terminal for alignment identification in the array substrate, and at the same position, it is used to transfer gate signals.

As shown in FIG. 9 (b), the second metal layer is patterned to form a second metal line 210 and the second alignment identification terminal 220. The second metal line 210 comprises a first data signal line 211, a second data signal line 212, a signal connection line 213, and the third data signal line 214. The alignment identification terminal 220 and the third data signal line 214 are integrally disposed. The alignment identification terminal 220 is used as a terminal for alignment identification in the array substrate, and at the same time, it is used to transfer data signals at its position.

As shown in FIG. 9 (c), the pixel electrode layer is patterned to form a pixel electrode. The pixel electrode comprises a plurality of first sub-pixel electrodes 310 and a plurality of second sub-pixel electrodes 320 arranged in an array.

As shown in FIG. 10, the first alignment terminal 120 and the second alignment terminal 220 are disposed opposite with each other, and projections of the first alignment terminal 120 and the second alignment terminal 220 on the substrate coincide.

A first portion of the second alignment identification terminal 220 is disposed in a first sub-pixel electrode region 310 and a second portion of the second alignment identification terminal is disposed in a second sub-pixel electrode region 320, and a third portion of the second alignment identification terminal connects to the first portion and the second portion is disposed in a non-pixel electrode region disposed between the first sub-pixel electrode region 310 and the second sub-pixel electrode region 320. The second alignment identification terminal 220 is disposed in a middle of two adjacent sub-pixel regions. A shape of the alignment identification terminal 220 is a cross shape. In other embodiments, the shape of the alignment identification terminal 220 may also be set to a rectangle, a circle, or any other recognizable shape, which is not limited herein.

In the embodiment, the alignment identification terminal 220 is arranged to across the pixels and is partially disposed in the two adjacent sub-pixel electrode regions. An arrangement of the alignment identification terminal is no longer limited by a narrow frame. A size of the alignment identification terminal can be made larger, which further ensures an accuracy of identification and alignment of the alignment identification terminal in a panel manufacturing process.

In the embodiment, the first alignment terminal 120 can be identified from a side facing away from the pixel electrode, and the second alignment terminal 220 can be identified from the pixel electrode side. The alignment identification terminal is suitable for a reflective light source.

When the array substrate is a dual gate structure, the first metal layer may be a first gate layer, and the second metal layer may be a second gate layer; the first metal layer may be a first gate layer, and the second metal layer may be a source-drain metal layer; the first metal layer may also be a second gate layer, and the second metal layer may also be a source-drain metal layer. The arrangement method of the alignment identification terminal is similar to the embodiment described above. For details, refer to the foregoing embodiment.

When the array substrate is an eight-domain structure, the arrangement method in which the alignment identification terminals are all disposed in the pixel electrode region is: the alignment identification terminals are disposed in a primary sub-pixel electrode region, or the alignment identification terminals are disposed in a secondary sub-subpixel region. For details, refer to the embodiments shown in FIG. 1 to FIG. 4 described above. The arrangement method in which part of the alignment identification terminals are disposed in the pixel electrode region is: a first portion of the alignment identification terminal is disposed in a primary sub-pixel electrode region, a second portion of the alignment identification terminal is disposed in a secondary sub-pixel electrode region, and a third portion of the alignment identification terminal connects to the first portion and the second portion is disposed in a non-pixel electrode region disposed between the primary sub-pixel electrode region and the secondary sub-pixel electrode region. For details, reference may be made to the embodiments shown in FIG. 5 to FIG. 10, and details are not described herein again.

Simultaneously, the present invention further provides a display panel comprising an array substrate. The array substrate comprises:

a base;

a first metal layer formed on the base;

a second metal layer formed on the first metal layer;

a pixel electrode layer formed on the second metal layer, wherein the pixel electrode layer is patterned to form a pixel electrode, and the pixel electrode comprises at least two sub-pixel electrodes; and an alignment identification terminal disposed in at least one of the first metal layer and the second metal layer, wherein the alignment identification terminal is at least partially disposed in a sub-pixel electrode region.

The embodiment provides a display panel comprising an array substrate. By disposing the alignment identification terminal in a display region of the substrate and at least partially within the sub-pixel electrode region, an arrangement of the alignment identification terminal is no longer limited by a narrow frame, and the size can be made larger to meet needs of a CCD identification, ensuring an accuracy of identification and alignment of the alignment identification terminal in a panel manufacturing process.

In an embodiment, the alignment identification terminal is disposed in the first metal layer.

In an embodiment, the alignment identification terminal is disposed in the second metal layer.

In an embodiment, the alignment identification terminal comprises a first alignment identification terminal and a second alignment identification terminal, the first alignment identification terminal is disposed in the first metal layer, and the second alignment identification terminal is disposed in the second metal layer.

In an embodiment, the first metal layer is a gate metal layer, and the second metal layer is a source-drain metal layer.

In an embodiment, the alignment identification terminals are all disposed in the sub-pixel electrode region.

In an embodiment, the alignment identification terminal is disposed at a middle position of the sub-pixel electrode region.

In an embodiment, a portion of the alignment identification terminal is disposed in the sub-pixel electrode region.

In an embodiment, a first portion of the alignment identification terminal is disposed in a first sub-pixel electrode region, a second portion of the alignment identification terminal is disposed in a second sub-pixel electrode region adjacent to the first sub-pixel electrode region, and a third portion of the alignment identification terminal connects to the first portion and the second portion is disposed in a non-pixel electrode region disposed between the first sub-pixel electrode region and the second sub-pixel electrode region.

In an embodiment, a shape of the alignment identification terminal is a cross shape.

In an embodiment, the display panel further comprise a black matrix. A projection of the black matrix is disposed on the substrate and covers an edge region of the projection of the alignment identification terminal on the substrate.

According to the above embodiment, it can be known that:

The present invention provides an array substrate and a display panel. The array substrate comprises a base, a first metal layer formed on the base, a second metal layer formed on the first metal layer, a pixel electrode layer formed on the second metal layer, wherein the pixel electrode layer is patterned to form a pixel electrode, and the pixel electrode comprises at least two sub-pixel electrodes, and an alignment identification terminal disposed in at least one of the first metal layer and the second metal layer, wherein the alignment identification terminal is at least partially disposed in a sub-pixel electrode region. By disposing the alignment identification terminal in a display region of the substrate and at least partially within the sub-pixel electrode region, an arrangement of the alignment identification terminal is no longer limited by a narrow frame, and the size can be made larger to meet the needs of the CCD identification, ensuring an accuracy of identification and alignment of the alignment identification terminal in a panel manufacturing process.

In summary, although the present invention has been disclosed above with preferred embodiments, the above preferred embodiments are not intended to limit the present invention. Persons of ordinary skill in the art can make various modifications and improvements without departing from the spirit and scope of the present invention. Therefore, the protection scope of the present invention is subject to the scope defined by the claims.

What is claimed is:

1. An array substrate, comprising:
    a base;
    a first metal layer formed on the base wherein the first metal layer is patterned to form a first metal line and a first alignment identification terminal, the first metal line comprises a first gate signal line and a second gate signal line;
    a second metal layer formed on the first metal layer; wherein the second metal layer is patterned to form a second metal line and a second alignment identification terminal, the second metal line comprises a first data signal line, a second data signal line, a signal connection line, and a third data signal line; and
    a pixel electrode layer formed on the second metal layer, wherein the pixel electrode layer is patterned to form a pixel electrode, and the pixel electrode comprises a first sub-pixel electrode and a second sub-pixel electrode, and the first sub-pixel electrode and the second sub-pixel electrode each has four domains;
    wherein the first alignment identification terminal is integrally formed with the second gate signal line, wherein the first alignment identification terminal is used for alignment identification in the array substrate, and to transfer gate signals;
    wherein the second alignment identification terminal is integrally formed with the third data signal line, wherein the second alignment identification terminal is used for alignment identification in the array substrate, and to transfer data signals;
    wherein the first alignment identification terminal and the second alignment identification terminal are disposed opposite with each other, and projections of the first alignment identification terminal and the second alignment identification terminal on the base coincide; wherein first portions of the first alignment identification terminal and the second alignment identification terminal are disposed in the first sub-pixel electrode, second portions of the first alignment identification terminal and the second alignment identification terminal are disposed in the second sub-pixel electrode, and central portions of the first alignment identification terminal and the second alignment identification terminal are disposed in non-pixel electrode region between the first sub-pixel electrode and the second sub-pixel electrode.

2. The array substrate as claimed in claim 1, wherein the first metal layer is a gate metal layer, and the second metal layer is a source-drain metal layer.

3. The array substrate as claimed in claim 1, wherein a shape of the first alignment identification terminal is a cross shape; and a shape of the second alignment identification terminal is a cross shape.

4. A display panel, comprising:
    an array substrate, wherein the array substrate comprises:
    a base;
    a first metal layer formed on the base; wherein the first metal layer is patterned to form a first metal line and a first alignment identification terminal, the first metal line comprises a first gate signal line and a second gate signal line;
    a second metal layer formed on the first metal layer; wherein the second metal layer is patterned to form a second metal line and a second alignment identification terminal, the second metal line comprises a first data signal line, a second data signal line, a signal connection line, and a third data signal line; and
    a pixel electrode layer formed on the second metal layer, wherein the pixel electrode layer is patterned to form a pixel electrode, and the pixel electrode comprises a first sub-pixel electrode and a second sub-pixel electrode, and the first sub-pixel electrode and the second sub-pixel electrode each has four domains;
    wherein the first alignment identification terminal is integrally formed with the second gate signal line, wherein the first alignment identification terminal is used for alignment identification in the array substrate, and to transfer gate signals;
    wherein the second alignment identification terminal is integrally formed with the third data signal line, wherein the second alignment identification terminal is used for alignment identification in the array substrate, and to transfer data signals;
    wherein the first alignment identification terminal and the second alignment identification terminal are disposed opposite with each other, and projections of the first alignment identification terminal and the second alignment identification terminal on the base coincide; wherein first portions of the first alignment identification terminal and the second alignment identification terminal are disposed in the first sub-pixel electrode, second portions of the first alignment identification terminal and the second alignment identification terminal are disposed in the second sub-pixel electrode, and central portions of the first alignment identification terminal and the second alignment identification terminal are disposed in a non-pixel electrode region between the first sub-pixel electrode and the second sub-pixel electrode.

5. The display panel as claimed in claim 4, wherein the first metal layer is a gate metal layer, and the second metal layer is a source-drain metal layer.

6. The display panel as claimed in claim 4, wherein a shape of the first alignment identification terminal is a cross shape; and a shape of the second alignment identification terminal is a cross shape.

* * * * *